United States Patent
Suto et al.

(10) Patent No.: US 10,103,312 B2
(45) Date of Patent: Oct. 16, 2018

(54) THERMOELECTRIC CONVERSION DEVICE

(71) Applicant: TOYOTA JIDOSHA KABUSHIKI KAISHA, Toyota-shi, Aichi-ken (JP)

(72) Inventors: Hiroyuki Suto, Numazu (JP); Hidenari Yamamoto, Gotemba (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/585,886

(22) Filed: May 3, 2017

(65) Prior Publication Data

US 2017/0331025 A1    Nov. 16, 2017

(30) Foreign Application Priority Data

May 13, 2016 (JP) ................. 2016-097273

(51) Int. Cl.
*H01L 35/32* (2006.01)
*H01L 35/20* (2006.01)
*H01L 35/22* (2006.01)
*H01L 35/30* (2006.01)

(52) U.S. Cl.
CPC ........... *H01L 35/32* (2013.01); *H01L 35/20* (2013.01); *H01L 35/22* (2013.01); *H01L 35/30* (2013.01)

(58) Field of Classification Search
CPC ......... H01L 35/32; H01L 35/20; H01L 35/22; H01L 35/30
USPC ...................................... 136/236.1
See application file for complete search history.

(56) References Cited

U.S. PATENT DOCUMENTS

2018/0047886 A1* 2/2018 Ren .................. H01L 35/26

FOREIGN PATENT DOCUMENTS

| JP | H06-021518 A | 1/1994 |
| JP | H8-125234 A | 5/1996 |
| JP | H11-087789 A | 3/1999 |
| JP | 2013-8747 A | 1/2013 |

OTHER PUBLICATIONS

Liu, Wei et al. "Convergence of Conduction Bands as a Means of Enhancing Thermoelectric Performance of n-Type Mg2Si1-xSnx Solid Solutions". Physical Review Letters, vol. 108, pp. 166601-1-166601-5, 2012.

* cited by examiner

*Primary Examiner* — Jayne L Mershon
(74) *Attorney, Agent, or Firm* — Oliff PLC

(57) ABSTRACT

A thermoelectric conversion device including an n-type thermoelectric converter, a p-type thermoelectric converter, a high temperature-side electrode with which one end of the n-type thermoelectric converter and one end of the p-type thermoelectric converter are put into contact, a first low temperature-side electrode in contact with another end of the n-type thermoelectric converter, and a second low temperature-side electrode in contact with another end of the p-type thermoelectric converter, wherein in the n-type thermoelectric converter, the side in contact with the high temperature-side electrode is composed of a carrier generation semiconductor containing $Mg_2Sn$, and in the n-type thermoelectric converter, the side in contact with the first low temperature-side electrode is composed of a carrier transfer semiconductor containing $Mg_2Si_{1-x}Sn_x$, wherein $0.6 \leq x \leq 0.7$, and a first n-type dopant.

6 Claims, 3 Drawing Sheets

SOURCE: Wei Liu, et al., Physical Review Letters, 108, 166601, (2012)

THERMOELECTRIC CONVERSION DEVICE

TECHNICAL FIELD

The present invention relates to a thermoelectric conversion device. More specifically, the present invention relates to a thermoelectric conversion device excellent in the power generation performance at a high temperature.

BACKGROUND ART

In order to effectively utilize heat discharged from factories, automobiles, electronic equipment, etc., a thermoelectric conversion device for converting thermal energy to electric energy is being studied.

When a temperature difference is provided between one end and another end of a semiconductor, a thermoelectromotive force is generated between one end and another end of the semiconductor. For example, when the temperature at one end of an n-type semiconductor is made higher than the temperature at another end, a carrier on the high temperature side transfers to the low temperature side (another end), and a thermoelectromotive force is thereby generated. Similarly, when a temperature difference is provided between one end and another end of a p-type semiconductor, a thermoelectromotive force in an opposite direction to that in the case of an n-type semiconductor is generated.

In a conventional thermoelectric conversion device, a temperature difference (gradient) between a high temperature region and a low temperature region, i.e., a difference in the average kinetic energy of majority carrier, works out to a driving force (Seebeck effect). For example, when a temperature difference between a high temperature region and a low temperature region is 300 K, the temperature difference is converted to an average kinetic energy of approximately 28 meV, and the output of a single device is consequently less than 50 mV. The device can be therefore hardly used as a power device only by joining an electrode to both ends of an n-type semiconductor or a p-type semiconductor. Accordingly, various efforts are being undertaken to use the device as a power device.

For example, Patent Document 1 discloses a so-called π-type thermoelectric conversion device. In the π-type thermoelectric conversion device, a common electrode is attached to one end of an n-type semiconductor and one end of a p-type semiconductor, and individual electrodes are attached respectively to another end of the n-type semiconductor and another end of the p-type semiconductor. By establishing such a configuration, a total thermoelectromotive force of a thermoelectromotive force induced by the n-type semiconductor and a thermoelectromotive force induced by the p-type semiconductor is obtained. In addition, Patent Document 1 discloses using an n-type semiconductor prepared by dispersing a transition metal or a silicide of a transition metal in $Mg_2Si_{1-x}Sn_x$ doped with Bi, etc.

RELATED ART

Patent Document

[Patent Document 1] Japanese Unexamined Patent Publication No. 2013-008747

SUMMARY OF THE INVENTION

Problems to be Solved by the Invention

With respect to the π-type thermoelectric conversion device disclosed in Patent Document 1, the present inventors have found a problem that the power generation performance is low particularly the power generation performance at a high temperature is low.

The present invention has been made to solve the above-described problem. More specifically, an object of the present invention is to provide a thermoelectric conversion device exhibiting an excellent power generation performance even at a high temperature. Unless otherwise indicated, the "high temperature" as used in the present invention means that in using the thermoelectric conversion device, the temperature in the central part between a high temperature-side electrode and a low temperature-side electrode is 350° C. or more.

Means to Solve the Problems

As a result of numerous intensive studies to attain the object above, the present inventors have accomplished the present invention. The gist thereof is as follows.

<1> A thermoelectric conversion device including:
an n-type thermoelectric converter,
a p-type thermoelectric converter,
a high temperature-side electrode with which one end of the n-type thermoelectric converter and one end of the p-type thermoelectric converter are put into contact,
a first low temperature-side electrode in contact with another end of the n-type thermoelectric converter, and
a second low temperature-side electrode in contact with another end of the p-type thermoelectric converter, wherein
in the n-type thermoelectric converter, the side in contact with the high temperature-side electrode is composed of a carrier generation semiconductor containing $Mg_2Sn$, and
in the n-type thermoelectric converter, the side in contact with the first low temperature-side electrode is composed of a carrier transfer semiconductor containing $Mg_2Si_{1-x}Sn_x$, wherein $0.6 \leq x \leq 0.7$, and a first n-type dopant.

<2> The thermoelectric conversion device according to item <1>, wherein the energy level at the top of the valence band is lower in the carrier transfer semiconductor than in the carrier generation semiconductor.

<3> The thermoelectric conversion device according to item <1> or <2>, wherein the concentration of the first n-type dopant in the carrier transfer semiconductor is increased from the carrier generation semiconductor side toward the first low temperature-side electrode side.

<4> The thermoelectric conversion device according to item <1> or <2>, wherein
the carrier transfer semiconductor has a plurality of regions, and
the concentration of a first n-type dopant in the plurality of regions is increased from the carrier generation semiconductor side toward the first low temperature-side electrode side.

<5> The thermoelectric conversion device according to any one of items <1> to <4>, wherein the first n-type dopant is selected from a group consisting of Sb, Bi and Al, and combination thereof.

<6> The thermoelectric conversion device according to any one of items <1> to <5>, wherein the carrier generation semiconductor further contains one or more second n-type dopants selected from Sb, Bi and Al.

Effects of the Invention

According to the present invention, generation of the majority carrier can be promoted in the carrier generation semiconductor of the n-type thermoelectric converter to provide a large majority carrier density gradient between the high temperature-side electrode and the first low temperature-side electrode. As a result, according to the present invention, a thermoelectric conversion device exhibiting an excellent power generation performance even at a high temperature due to gaining a driving force for power generation by virtue of the majority carrier density gradient, compared with a conventional thermoelectric conversion device relying only on the Seebeck effect, can be provided.

Furthermore, according to the present invention, the energy level at the top of the valence band is lower in the carrier transfer semiconductor than in the carrier generation semiconductor, whereby the power generation performance of the thermoelectric conversion device at a high temperature can be more enhanced.

MODE FOR CARRYING OUT THE INVENTION

Figure 1:
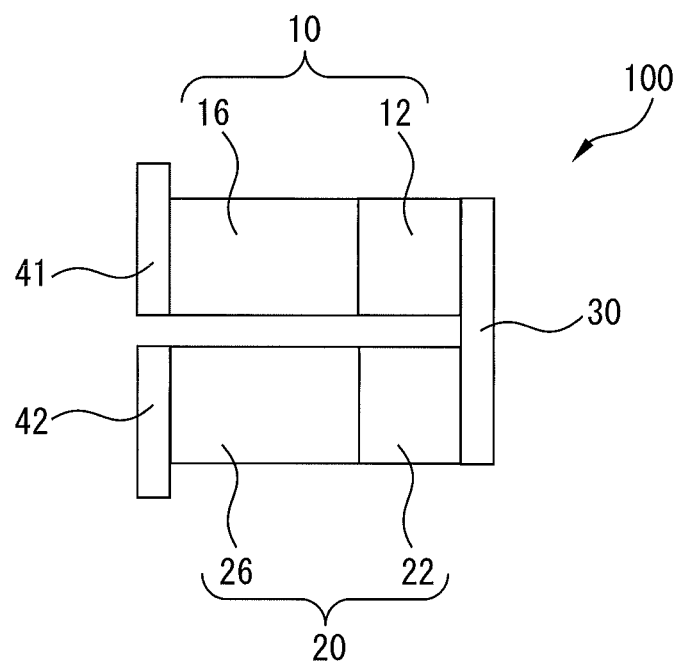
FIG. 1 A schematic view illustrating one example of the embodiment of the thermoelectric conversion device of the present invention.

With respect to the thermoelectric conversion device according to the present invention, embodiments thereof are described in detail below. The present invention is not limited to the following embodiments.

The thermoelectric conversion device generates power by utilizing the Seebeck effect. More specifically, when the temperature at one end of a semiconductor is made higher than that at another end, carriers having a high kinetic energy on the high temperature side diffuse to the low temperature side, whereby a thermoelectromotive force is generated. At this time, the power generation capacity is evaluated by the Seebeck coefficient α (V/K) indicating the thermoelectromotive force per temperature difference.

A current flows from the low temperature side to the high temperature side in an n-type semiconductor and flows from the high temperature side to the low temperature side in a p-type semiconductor. A device fabricated utilizing this current movement, in which an n-type semiconductor and a p-type semiconductor are combined, a common electrode (high temperature-side electrode) is attached to one end at which the temperature is made high, and individual electrodes (low temperature-side electrodes) are attached to respective another ends, is a π-type thermoelectric conversion device.

In the conventional π-type thermoelectric conversion device, only the Seebeck effect is a driving force for power generation and the output voltage between the high temperature-side electrode and the low temperature-side electrode is therefore as low as approximately several tens of mV.

When the temperature of a semiconductor is raised, the minority carrier is also generated together with the majority carrier. In the n-type semiconductor, an electron is the majority carrier, and a hole is the minority carrier. In the p-type semiconductor, a hole is the majority carrier, and an electron is the minority carrier.

At a high temperature, thermal excitation excessively occurs in the semiconductor to cause not only the generation of majority carriers but also the generation of the same number of minority carries, and the effect of the minority carrier on the power generation performance of a thermoelectric conversion device cannot be therefore ignored. More specifically, as with the majority carrier, these minority carriers diffuse from the high temperature side to the low temperature side, as a result, the power generation performance is reduced.

In order to enhance the power generation performance at a high temperature of the π-type thermoelectric conversion device, the present inventors have come up with the ideas of, firstly, causing the driving force of the majority carrier to increase in the vicinity of the high temperature-side electrode and, secondly, not allowing the minority carrier to transfer from the high temperature-side electrode to the low temperature-side electrode.

The present inventors have found that when the majority carrier density gradient is increased between the high temperature-side electrode and the low temperature-side electrode, the first idea can be realized.

The present inventors have also found that the second idea can be realized by the following configuration. More specifically, the present inventors have found that the energy level of the valence band of an n-type thermoelectric converter is made higher in a portion in contact with the high temperature-side electrode than in a portion in contact with the low temperature-side electrode, as a results, transfer of the minority carrier from a high temperature-side electrode to a low temperature-side electrode hardly occur.

The configuration of the thermoelectric conversion device according to the present invention based on these findings is described below. FIG. 1 is a schematic view illustrating one example of the embodiment of the thermoelectric conversion device of the present invention. The thermoelectric conversion device 100 of the present invention comprises an n-type thermoelectric converter 10 and a p-type thermoelectric converter 20. In addition, the thermoelectric conversion device 100 of the present invention has a high temperature-side electrode 30, a first low temperature-side electrode 41, and a second low temperature-side electrode 42.

(High Temperature-Side Electrode)

The high temperature-side electrode 30 is in contact with one end of the n-type thermoelectric converter 10 and one end of the p-type thermoelectric converter 20. To be more specific, the high temperature-side electrode 30 is a common electrode shared with the n-type thermoelectric converter 10 and the p-type thermoelectric converter 20.

As the high temperature-side electrode 30, the high temperature-side electrode of the conventional π-type thermoelectric conversion device can be used. Examples thereof include a material based on a transition metal such as nickel (Ni), titanium (Ti), copper (Cu), aluminum (Al) and iron (Fe). Particularly, nickel (Ni) is preferred because of its high melting point of 1,455° C. and excellent heat resistance.

(First Low Temperature-Side Electrode and Second Low Temperature-Side Electrode)

The first low temperature-side electrode 41 is in contact with another end of the n-type thermoelectric converter 10, and the second low temperature-side electrode 42 is in contact with another and of the p-type thermoelectric converter 20. That is, the first low temperature-side electrode 41 and the second low temperature-side electrode are separate electrodes.

As the first low temperature-side electrode 41 and the second low temperature-side electrode 42, the first low temperature-side electrode and the second low temperature-side electrode of the conventional π-type thermoelectric conversion device can be used. Examples thereof include a material based on a transition metal as nickel (Ni), titanium (Ti), copper (Cu), aluminum (Al) and iron (Fe). Particularly, nickel (Ni) is preferred because of its high melting point of 1,455° C. and excellent heat resistance. The first low temperature-side electrode 41 and the second low temperature-side electrode 42 may be made of the same kind of material or may be made of different kinds of materials. In addition, the first low temperature-side electrode 41 and the high temperature-side electrode 30 may be made of the same kind of material or may be made of different kinds of materials, and the second low temperature-side electrode 42 and the high temperature-side electrode 30 may be made of the same kind of material or may be made of different kinds of materials.

(Operation of Thermoelectric Conversion Device of the Present Invention)

When the temperature of the high temperature-side electrode 30 becomes higher than the temperatures of the first low temperature-side electrode 41 and the second low temperature-side electrode 42, the thermoelectric conversion device 100 generates electricity, and by connecting a load (not depicted) such as resistive device between the first low temperature-side electrode 41 and the second low temperature-side electrode 42, a current flows. More specifically, in the inside of the n-type thermoelectric converter 10, electrons diffuse from the high temperature-side electrode 30 to the first low temperature-side electrode 41 and therefore, a current flows from the first low-temperature-side electrode 41 toward the high temperature-side electrode 30. In the inside of the p-type thermoelectric converter 20, holes diffuse from the high temperature-side electrode 30 toward the second low temperature-side electrode 42 and therefore, a current flows from the high temperature-side electrode 30 toward the second low temperature-side electrode 42.

The n-type thermoelectric converter 10, the carrier generation semiconductor 12, the carrier transfer semiconductor 16, and the p-type thermoelectric converter 20 are described below.

(n-Type Thermoelectric Converter)

The n-type thermoelectric converter is composed of a carrier generation semiconductor 12 in the side in contact with the high temperature-side electrode 30 and composed of a carrier transfer semiconductor 16 in the side in contact with the first low temperature-side electrode 41.

Figure 2:
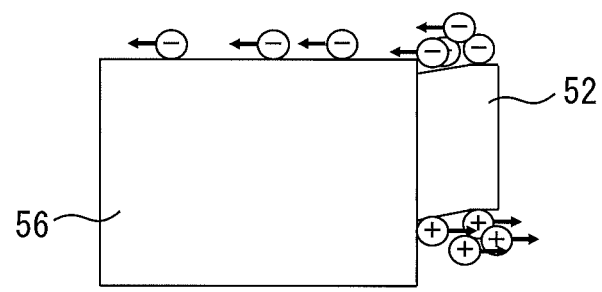
FIG. 2 A view illustrating the distribution of forbidden bands of the carrier generation semiconductor and the carrier transfer semiconductor in the thermoelectric conversion device of the present invention.

FIG. 2 is a view illustrating the distribution of forbidden bands of the carrier generation semiconductor 12 and the carrier transfer semiconductor 16 in the thermoelectric conversion device 100 of the present invention. The lateral direction in FIG. 2 indicates the distance from the high temperature-side electrode 30 or the distance from the first low temperature-side electrode 41. The right-hand edge of FIG. 2 indicates a contact surface between the high temperature-side electrode 30 and the carrier generation semiconductor 12, and the left-hand edge of FIG. 2 indicates a contact surface between the first low temperature-side electrode 41 and the carrier transfer semiconductor 16. On the other hand, the vertical direction of FIG. 2 indicates the energy level. In FIG. 2, an energy level closer to the top is higher. The forbidden band indicates, in the band structure of a semiconductor, energy levels between the top of a highest energy band (valence band) occupied by electrons and the bottom of a lowest energy band (conduction band).

In order to realize the first idea, as illustrated in FIG. 2, with respect to the energy level, the width of the forbidden band 52 of the carrier generation semiconductor 12 is narrower than the width of the forbidden band 56 of the carrier transfer semiconductor 16. In addition, it is preferred that the difference between the bottom of the conduction band of the carrier generation semiconductor 12 and the bottom of the conduction band of the carrier transfer semiconductor 16 is small or the bottom of the conduction band of the carrier generation semiconductor 12 is located above the bottom of the conduction band of the carrier transfer semiconductor 16.

In order for an electron in the semiconductor to transit across the forbidden band to the conduction band, the electron in the semiconductor must absorb an energy (heat) larger than the forbidden band width.

In the conventional thermoelectric conversion device, between the high temperature-side electrode 30 and the first low temperature-side electrode 41, a single thermoelectric conversion semiconductor or a plurality of heterojunctioned thermoelectric conversion semiconductors are arranged in order of decreasing forbidden band width from the high temperature-side electrode 30 side. In the conventional thermoelectric conversion device, the driving force for power generation is only a temperature gradient (kinetic energy difference) between the high temperature-side electrode 30 and the first low temperature-side electrode 41, and the driving force is therefore small. Here, the conventional thermoelectric conversion device sometimes has a structure in which, as described above, a plurality of thermoelectric conversion semiconductors are heterojunctioned (cascade type). In this case, the plurality of thermoelectric conversion semiconductors are arranged in the order of decreasing forbidden band width from the high temperature-side electrode 30 side. Such an arrangement is made to prevent production of an electron-hole pair but not to reinforce the driving force itself for power generation by a charge density gradient.

On the other hand, in the thermoelectric conversion device 100, heterojunctioned different semiconductors are arranged between the high temperature-side electrode 30 and the first low temperature-side electrode 41. These different semiconductors are a carrier generation semiconductor 12 and a carrier transfer semiconductor 16 and with respect to the energy level, the width of the forbidden band 52 of the carrier generation semiconductor 12 is narrower than the width of the forbidden band 56 of the carrier transfer semiconductor 16. Consequently, the majority carrier is readily generated in the carrier generation semiconductor 12 than in the carrier transfer semiconductor 16, and the majority carrier density in the carrier generation semiconductor 12 is therefore high compared with the carrier transfer semiconductor 16.

The forbidden band widths of the carrier generation semiconductor 12 and the carrier transfer semiconductor 16 are adjusted in this way, whereby the majority carrier density gradient can be increased between the high temperature-side electrode 30 and the first low temperature-side electrode 41.

Thus, as to the thermoelectric conversion device 100 of the present invention, the driving force of the majority carrier can be increased at a high temperature. Consequently, the thermoelectric conversion device 100 of the present invention exhibits an excellent power generation performance at a high temperature, compared with the conventional thermoelectric conversion device.

The carrier generation semiconductor 12 and the carrier transfer semiconductor 16, having the distribution of forbidden bands illustrated in FIG. 2, are described below.

(Carrier Generation Semiconductor)

The carrier generation semiconductor 12 contains $Mg_2Sn$. The carrier generation semiconductor 12 may contain a dopant and an unavoidable impurity, in addition its $Mg_2Sn$. In the case of containing a dopant, the dopant substitutes for Mg or Sn. Since, Mg charges positively and Si charges negatively in a $Mg_2Sn$ crystal, a cation of dopant substitutes for Mg and an anion substitutes for Sn. Furthermore, the melting point of Sn is lower than the melting point of Mg, a majority of the dopant substitutes for Sn. The dopant is described later. The unavoidable impurity indicates an impurity whose inclusion cannot be avoided, such as impurity contained in a raw material, or an impurity that involves a significant rise in the production cost to avoid its inclusion. The purity of $Mg_2Sn$ (excluding the dopant) is, in mass %, preferably 99.0% or more, more preferably 99.5% or more, still more preferably 99.9% or more. $Mg_2Sn$ is not particularly limited as long as it is a semiconductor, but the semiconductor is generally a polycrystalline semiconductor such as sintered body.

As described above, the forbidden band width of the carrier generation semiconductor 12 is narrower than the forbidden band width of the carrier transfer semiconductor 16. Since the main component of the carrier generation semiconductor 12 is $Mg_2Sn$, it may be sufficient if the forbidden band of $Mg_2Sn$ is narrower than the forbidden band of the main component of the carrier transfer semiconductor 16. The main component of the carrier transfer semiconductor 16 is described below.

(Carrier Transfer Semiconductor)

The carrier transfer semiconductor 16 contains $Mg_2Si_{1-x}Sn_x$ ($0.6 \leq x \leq 0.7$) and a first n-type dopant. $Mg_2Si_{1-x}Sn_x$ is a semiconductor where Si in $Mg_2Si$ is substituted in part by Sn. The substitution rate x is from 0.6 to 0.7, and the reason therefor is described later.

The first n-type dopant is added in a small amount to $Mg_2Si_{1-x}Sn_x$ ($0.6 \leq x \leq 0.7$) and has a function of promoting transfer of the majority carrier within the carrier generation semiconductor 12. The first n-type dopant is not particularly limited as long as it exerts the function above. From the viewpoint that the above-described function is effectively exerted, the first n-type dopant is preferably one or more members selected from Sb, Bi and Al. $Sb^{3-}$ and $Bi^{3-}$ are arranged at the location of Si and/or Sn, and $Al^{3+}$ is arranged at the location of Mg.

The first n-type dopant substitutes for one or more elements selected from Mg, Si and Sn. The lower the melting point of the element is, the easier the substitution of the element is. The elements are easily substituted in the order of Sn, Mg and Si, thus, a majority of the first n-type dopant substitutes for Sn.

The content of the first n-type dopant is preferably from 0.010 to 0.100 mol. In the case of containing two or more kinds of first n-type dopant, the content of the first n-type dopant is the total thereof. When the content of the first n-type dopant is 0.010 mol or more, the above-described function of the n-type dopant is substantially recognized. The content of the first n-type dopant may be 0.020 mol or more, or 0.030 mol or more. On the other hand, when the content of the first n-type dopant is 0.100 mol or less, the above-described function is not saturated. The content of the first n-type dopant may be 0.080 mol or less, 0.070 mol or less, 0.060 mol or less, 0.050 mol or less, or 0.040 mol of less.

The carrier transfer semiconductor 16 may contain an unavoidable impurity, in addition of $Mg_2Si_{1-x}Sn_x$ ($0.6 \leq x \leq 0.7$) and the first n-type dopant. The unavoidable impurity indicates an impurity whose inclusion cannot be avoided, such as impurity contained in a raw material, or an impurity that involves a significant rise in the production cost to avoid its inclusion. The purity of $Mg_2Si_{1-x}Sn_x$ ($0.6 \leq x \leq 0.7$) (excluding the first n-type dopant) is, in mass %, preferably 99.0% or more, more preferably 99.5% or more, still more preferably 99.9% or more. $Mg_2Si_{1-x}Sn_x$ ($0.6 \leq x \leq 0.7$) is not particularly limited as long as it is a semiconductor, but the semiconductor is generally a polycrystalline semiconductor such as sintered body.

Since the main component of the carrier transfer semiconductor 16 is $Mg_2Si_{1-x}Sn_x$ ($0.6 \leq x \leq 0.7$), the forbidden band of $Mg_2Sn$ is narrower than the forbidden band of $Mg_2Si_{1-x}Sn_x$ ($0.6 \leq x \leq 0.7$).

Figure 3:
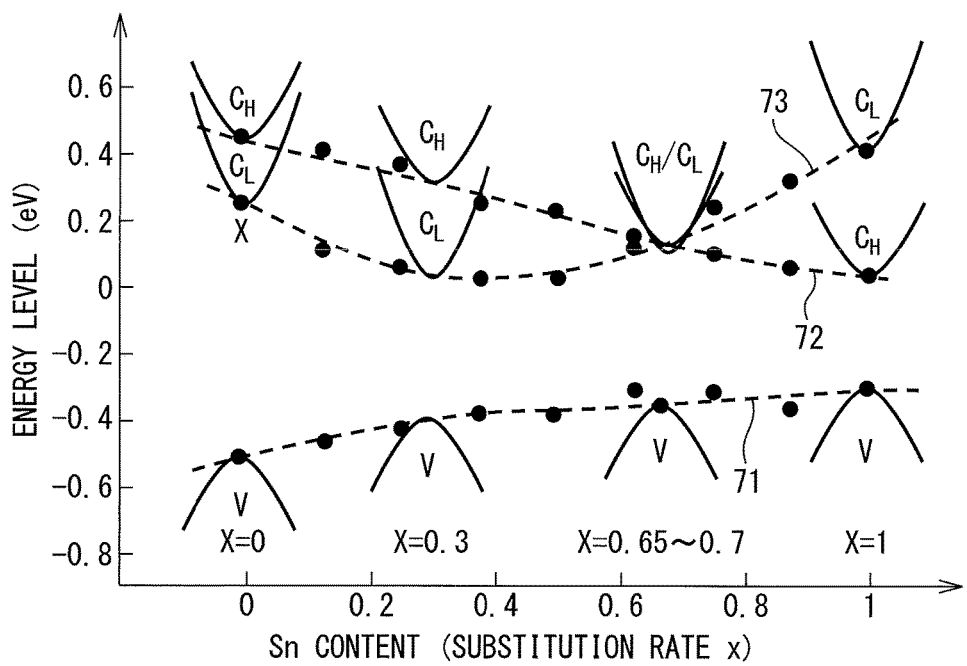
FIG. 3 A graph illustrating the relationship between the Sn content in $Mg_2Si_{1-x}Sn_x$ and the energy level.

FIG. 3 is a graph illustrating the relationship between the Sn content in $Mg_2Si_{1-x}Sn_x$ and the energy level. The abscissa indicates the proportion (substitution rate x) in which Si in $Mg_2Si$ is substituted by Sn, and the ordinate indicates the energy level (eV). The left-hand edge (x=0) of the abscissa is $Mg_2Si$, and the right-hand edge (x=1) of the abscissa is $Mg_2Sn$. Here, the source of FIG. 3 is Wei Liu, et al., "Physical Review Letters", 108, 166601, (2012).

As seen from FIG. 3, the top 71 of the valence band ascends as the Sn content in $Mg_2Si_{1-x}Sn_x$ increases, and the bottom 72 of the conduction band in a certain orientation of the crystal represented by $Mg_2Si_{1-x}Sn_x$ descends as the Sn content in the $Mg_2Si_{1-x}Sn_x$ increases. In the range where x of $Mg_2Si_{1-x}Sn_x$ is from 0 to about 0.5, the bottom 73 of the conduction band in a different orientation of the crystal represented by $Mg_2Si_{1-x}Sn_x$ descends, and in the range where x is from about 0.5 to 1, the bottom 73 of the conduction band in the different orientation of the crystal represented by $Mg_2Si_{1-x}Sn_x$ ascends. As understood from these, the top of the valence band does not rely on the crystal orientation of $Mg_2Si_{1-x}Sn_x$, whereas the bottom of the conduction band relies on the crystal orientation of $Mg_2Si_{1-x}Sn_x$.

The forbidden band of $Mg_2Si_{1-x}Sn_x$ is the difference between the bottom 72 of the conduction band and the top 71 of the valence band or the difference between the bottom 73 of the conduction band and the top 71 of the valence band, whichever is smaller. As described above, the bottom of the conduction band relies on the crystal orientation of $Mg_2Si_{1-x}Sn_x$. In order for an electron in the $Mg_2Si_{1-x}Sn_x$ to transit across the forbidden band to the conduction band, the electron in the $Mg_2Si_{1-x}Sn_x$ must absorb an energy larger than the forbidden band width. $Mg_2Si_{1-x}Sn_x$ may be sufficient if it absorbs an energy larger than the forbidden band width with respect to any crystal orientation in $Mg_2Si_{1-x}Sn_x$. Accordingly, the forbidden band of $Mg_2Si_{1-x}Sn_x$ may be the difference between the bottom 72 of the conduction band and the top 71 of the valence band or the difference between the bottom 73 of the conduction band and the top 71 of the valence band, whichever is smaller.

When the forbidden band of $Mg_2Si_{1-x}Sn_x$ is defined in accordance with FIG. 3, in the range of $0.6 \leq x \leq 0.7$, the forbidden band of $Mg_2Sn$ is narrower than the forbidden band of $Mg_2Si_{1-x}Sn_x$. For this reason, when a temperature difference between electrodes is provided, the majority carrier density of the carrier generation semiconductor 12 containing $Mg_2Sn$ becomes higher than the majority carrier density of the carrier transfer semiconductor 16 containing $Mg_2Si_{1-x}Sn_x$ ($0.6 \leq x \leq 0.7$) and the first n-type dopant. As a result, a majority carrier density gradient is created in the n-type thermoelectric converter 10 having the carrier generation semiconductor 12 and the carrier transfer semiconductor 16. This is prominent when the temperature of the thermoelectric conversion device 100 is high.

$Mg_2Si_{1-x}Sn_x$ is a semiconductor where Si in $Mg_2Si$ is substituted in part by Sn, and $Mg_2Sn$ is a semiconductor where Si in $Mg_2Si$ is substituted in whole by Sn. Consequently, as illustrated in FIG. 3, the difference between the bottom of the conduction band of $Mg_2Sn$ and the bottom of the conduction band of $Mg_2Si_{1-x}Sn_x$ is small and therefore, the majority carrier readily transfers to the carrier transfer semiconductor 16 from the carrier generation semiconductor 12. When the carrier generation semiconductor 12 and the carrier transfer semiconductor 16 are heterojunctioned and then heat-treated, atoms mutually diffuse between the carrier generation semiconductor 12 and the carrier transfer semiconductor 16, and the difference between the bottom of the conduction band of $Mg_2Sn$ and the bottom of the conduction band of $Mg_2Si_{1-x}Sn_x$ is more reduced.

The carrier generation semiconductor 12 can generate a larger number of majority carriers by absorbing heat as much as possible from the high temperature-side electrode 30, and it is therefore preferred that in the inside of the carrier generation semiconductor 12, the temperature gradient is as small as possible and the temperature of the carrier generation semiconductor 12 and the temperature of the high temperature-side electrode 30 are identical as much as possible. Accordingly, the thickness of the carrier generation semiconductor 12 is preferably not too large. On the other hand, in order for the carrier generation semiconductor 12 to generate a sufficient number of majority carriers, the carrier generation semiconductor 12 needs to have a thickness not less than a certain value.

The thickness of the carrier generation semiconductor 12 is preferably from 2 to 10% of the thickness of the carrier transfer semiconductor 16. When the thickness of the carrier generation semiconductor 12 is 2% or more of the thickness of the carrier transfer semiconductor 16, the carrier generation semiconductor 12 has no lack of the volume as a semiconductor generating the majority carrier. From this viewpoint, the thickness of the carrier generation semiconductor 12 is more preferably 4% or more, still more preferably 5% or more, of the thickness of the carrier transfer semiconductor 16. On the other hand, when the thickness of the carrier generation semiconductor 12 is 10% or less of the thickness of the carrier transfer semiconductor 16, a temperature gradient is substantially not created inside the carrier generation semiconductor 12. From this viewpoint, the thickness of the carrier generation semiconductor 12 is more preferably 8% or less, still more preferably 7% or less, of the thickness of the carrier transfer semiconductor 16. Here, the thickness of the carrier generation semiconductor 12 indicates the length of the carrier generation semiconductor 12 in a direction perpendicular to the high temperature-side electrode 30 and the first low temperature-side electrode 41.

While to increase the majority carrier is described in the foregoing pages, the above-described second idea of hardly allowing the minority carrier to transfer from the high temperature-side electrode to the low temperature-side electrode is described below.

(Energy Level at Top of Valence Band)

The energy level at the top of the valence band is preferably lower in the carrier transfer semiconductor 16 than in the carrier generation semiconductor 12.

When in the n-type thermoelectric converter 10, the side in contact with the high temperature-side electrode 30 is the carrier generation semiconductor 12, the same number of minor carriers as the number of majority carriers are generated by thermal excitation in the carrier generation semiconductor 12. As illustrated in FIG. 3, the energy level at the top of the valence band of the carrier transfer semiconductor 16 is made lower than the energy level at the top of the valence band of the carrier generation semiconductor 12, and the minority carrier is thereby less likely to transfer to the carrier transfer semiconductor 16 from the carrier generation semiconductor 12. In the following description, making the energy level at the top of the valence band of the carrier transfer semiconductor 16 lower than the energy level at the top of the valence band of the carrier generation semiconductor 12 is sometimes referred to as "creating a step in the energy level at the top of the valence band".

In order to realize the creation of a step in the energy level at the top of the valence band, it is effective to increase the content of the first n-type dopant in the carrier transfer semiconductor 16. When the content of the first n-type dopant is increased, the energy level at the top of the valence band of $Mg_2Si_{1-x}Sn_x$ ($0.6 \leq x \leq 0.7$) can be lowered. From this viewpoint, the content of the first n-type dopant is preferably 0.030 mol or more. On the other hand, when the content of the first n-type dopant is 0.100 mol or less, the function of reducing the energy level at the top of the valence band in $Mg_2Si_{1-x}Sn_x$ ($0.6 \leq x \leq 0.7$) is not saturated.

(First n-Type Dopant Concentration in Carrier Transfer Semiconductor)

The concentration of the first n-type dopant in the carrier transfer semiconductor 16 is preferably increased from the carrier generation semiconductor 12 side toward the first low temperature-side electrode 41 side. By doing so, the energy level at the bottom of the conduction band in the carrier transfer semiconductor 16 is decreased from the carrier generation semiconductor 12 side to the first low temperature-side electrode 41 side. Consequently, it becomes easy for the majority carrier to transfer from the carrier generation semiconductor 12 side toward the first low temperature-side electrode 41 side within the carrier transfer semiconductor 16. The diffusion of minority carriers to the first low temperature-side electrode 41 side can be suppressed.

When it becomes easy for the majority carrier to transfer in the carrier transfer semiconductor 16, the majority carrier is less likely to stay near the contact surface between the carrier transfer semiconductor 16 and the carrier generation semiconductor 12. Then, transfer of the majority carrier from the carrier generation semiconductor 12 to the carrier transfer semiconductor 16 is facilitated.

In the case where the carrier transfer semiconductor 16 is a sintered body, it is sometimes difficult to increase the concentration of the first n-type dopant in the carrier transfer semiconductor 16 from the carrier generation semiconductor 12 side toward the first low temperature-side electrode 41 side. In such a case, it may be possible that the carrier transfer semiconductor 16 has a plurality of regions and the concentration of the first n-type dopant in the plurality of regions is increased from the carrier generation semiconductor 12 side toward the first low temperature-side electrode 41 side.

Figure 4:
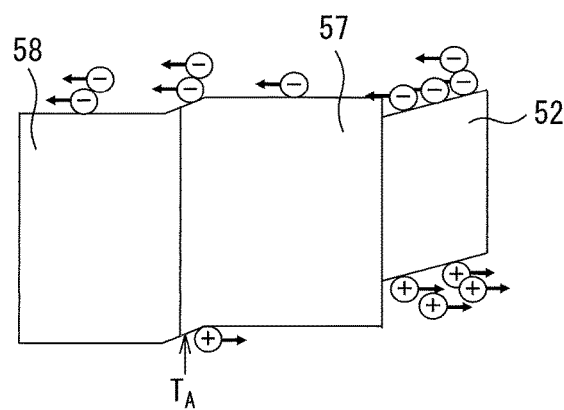
FIG. 4 A view illustrating the distribution of forbidden bands of the carrier generation semiconductor and the carrier transfer semiconductor in the thermoelectric conversion device of the present invention in which the carrier transfer semiconductor has two regions.

FIG. 4 is a view illustrating the distribution of forbidden bands of the carrier generation semiconductor 12 and the carrier transfer semiconductor 16 in the thermoelectric conversion device 100 of the present invention in which the carrier transfer semiconductor 16 comprises two regions. The lateral direction and the vertical direction of FIG. 4 are the same as the lateral direction and the vertical direction of FIG. 2. The carrier transfer semiconductor 16 of the thermoelectric conversion device 100 having the distribution of forbidden bands illustrated in FIG. 4 comprises a region in contact with the carrier generation semiconductor 12 and a region in contact with the first low temperature-side electrode 41.

The concentration of the first n-type dopant in the region in contact with the first low temperature-side electrode 41 is higher than the concentration of the first n-type dopant in the region in contact with the carrier generation semiconductor 12. As illustrated in FIG. 4, the energy level of the forbidden band 58 in the region in contact with the first low temperature-side electrode 41 is consequently lower than the energy level of the forbidden band 57 of the region in contact with the carrier generation semiconductor 12. This configuration facilitates transfer of the majority carrier from the carrier generation semiconductor 12 side toward the first low temperature-side electrode 41 side within the carrier transfer semiconductor 16. In FIG. 4, a case where the carrier transfer semiconductor 16 comprises two regions is described, but without being limited thereto, the carrier transfer semiconductor 16 may have three or more regions.

As illustrated in FIG. 4, when the forbidden band 58 of the region in contact with the first low temperature-side electrode 41 is present closer to the first low temperature-side electrode 41 side relative to the temperature $T_A$ portion by the magnitude of the minority carrier diffusion length, diffusion of minority carriers to the first low temperature-side electrode 41 side can be suppressed. Here, the temperature $T_A$ is a temperature represented by $T_A = E_g(A)/10 \, k_b$ (wherein $E_g(A)$ is the energy level of the forbidden band 58 of the region in contact with the first low temperature-side electrode 41, and $k_b$ is the Boltzmann constant).

(p-Type Thermoelectric Converter)

As illustrated in FIG. 1, as with the n-type thermoelectric converter 10 comprising a carrier generation semiconductor 12 and a carrier transfer semiconductor 16, the p-type thermoelectric converter 20 may have a carrier generation semiconductor 22 and a carrier transfer semiconductor 26. Alternatively, it may be also possible that the p-type thermoelectric converter 20 does not comprise a carrier generation semiconductor 22 and the p-type thermoelectric converter 20 as a whole is composed of a carrier transfer semiconductor 26.

In the case where the p-type thermoelectric converter 20 comprises a carrier generation semiconductor 22 and a carrier transfer semiconductor 26, the forbidden band width of the carrier generation semiconductor 22 is narrower than the forbidden band width of the carrier transfer semiconductor 26.

(Modification)

In addition to the configuration requirements described above, the thermoelectric conversion device 100 of the present invention may satisfy the following configuration requirements, if necessary.

(Second n-Type Dopant)

The carrier generation semiconductor 12 may further contain one or more second n-type dopants selected from Sb, Bi and Al. Containing this dopant facilitates generation of the majority carrier in the carrier generation semiconductor 12.

The content of the second n-type dopant is preferably from 0.010 to 0.100 mol. In the case of containing two or more kinds of second n-type dopants, the content of the second n-type dopant is the total thereof. When the content of the second n-type dopant is 0.010 or more, the above-described function of the second n-type dopant is substantially recognized. The content of the second n-type dopant may be 0.020 mol or more, or 0.030 mol or more. On the other hand, when the content of the second n-type dopant is 0.100 mol or less, the above-described function is not saturated. The content of the second n-type dopant may be 0.080 mol or less, 0.070 mol or less, 0.060 mol or less, 0.050 mol or less, or 0.040 mol of less.

When the carrier generation semiconductor 12 contains the second n-type dopant, the energy level at the top of the valence band of the carrier generation semiconductor 12 decreases. In the case of making the energy level at the top of the valence band of the carrier transfer semiconductor 16 lower than the energy level at the top of the valence band of the carrier generation semiconductor 12, the content of the first n-type dopant is preferably larger than the content of the second n-type dopant. By doing so, transfer of the minority carrier from the carrier generation semiconductor 12 to the carrier transfer semiconductor 16 becomes difficult.

Furthermore, in the case where the carrier generation semiconductor 12 contains the second n-type dopant, the following advantages are offered. By making the concentration of the first n-type dopant of the carrier transfer semiconductor 16 higher than the concentration of the second n-type dopant of the carrier generation semiconductor 12, the forbidden band of the carrier transfer semiconductor 16 can be relatively lowered. By doing so, the difference between the bottom of the conduction band of the carrier generation semiconductor 12 and the bottom of the conduction band of the carrier transfer semiconductor 16 is more reduced. When the difference between the concentration of the second n-type dopant and the concentration of the first n-type dopant is more increased, the bottom of the conduction band in a region (the high temperature-side electrode 30 side) distant from the junction of the carrier generation semiconductor 12 can be adjusted to be located above the conduction band of a region distant from the junction of the carrier transfer semiconductor 16.

(Production Method)

The production method of the thermoelectric conversion device of the present invention is described below. As long as the thermoelectric conversion device satisfies the configuration requirements described above, the production method thereof is not particularly limited. The production method includes, for example, the following production method.

(Production of Powder)

An $Mg_2Si_{1-x}Sn_x$ (0.6≤x≤0.7) powder is produced, for example, as follows. An Mg powder, an Si powder and an Sn powder are weighed to provide the composition represented by $Mg_2Si_{1-x}Sn_x$ (0.6≤x≤0.7). The first n-type dopant powder is weighed, and these powders are mixed to obtain a mixture. This mixture is heated to mutually diffuse Mg, Si, Sn and n-type dopant device and obtain an aggregate. The aggregate is disintegrated to obtain an $Mg_2Si_{1-x}Sn_x$ (0.6≤x≤0.7) powder.

The particle diameters of the Mg powder, Si powder, Sn powder and first n-type dopant powder are not particularly limited as long as mutual diffusion of Mg, Si, Sn and first n-type dopant is not obstructed. In the following description, unless otherwise indicated, the particle diameter means the average particle diameter. The average particle diameter conforms to the volume distribution median diameter (d(50)), and the measurement of the average particle diameter is measured by the laser diffraction-type particle size distribution measuring method.

The particle diameter of the Mg powder may be 1 μm or more, 10 μm or more, 50 μm or more, or 80 μm or more, and may be 200 μm or less, 150 μm or less, 120 μm or less, or 100 μm or less.

The particle diameter of the Si powder may be 1 μm or more, 10 μm or more, or 40 μm or more, and may be 150 μm or less, 100 μm or less, or 50 μm or less.

The particle diameter of the Sn powder may be 1 μm or more, 10 μm or more, or 30 μm or more, and may be 100 μm or less, 70 μm or less, 40 μm or less.

The particle diameter of the first n-type dopant powder may be 1 μm or more, 10 μm or more, or 30 μm or more, and may be 100 μm or less, 70 μm or less, 40 μm or less.

The heating temperature is preferably a temperature at which at least either the Mg powder or the Sn powder is melted. The heating temperature may be 600° C. or more, 640° C. or more, or 680° C. or more, and may be 800° C. or less, 760° C. or less, or 720° C. or less.

The heating time may be appropriately selected according to the amount of the powder. The heating time may be 60 minutes or more, 180 minutes or more, 360 minutes or more, or 540 minutes or more, and may be 3,000 minutes or less, 1,500 minutes or less, 1,000 minutes or less, or 800 minutes or less.

In order to prevent oxidation of the powder, the heating atmosphere is preferably an inert gas atmosphere or a reducing atmosphere. The inert gas atmosphere includes a nitrogen gas atmosphere. The reducing atmosphere includes a hydrogen gas atmosphere or a mixed gas atmosphere of inert gas and hydrogen gas.

As for the atmosphere pressure, a reduced pressure atmosphere is preferred in order for the atmosphere gas to easily reach between particles of the mixed powder. The atmosphere pressure may be 0.001 MPa or more, 0.005 MPa or more, or 0.008 MPa or more, and may be 0.1 MPa or less, 0.08 MPa or less, 0.06 MPa or less, or 0.02 MPa or less.

The $Mg_2Sn$ powder is produced, for example, as follows. An Mg powder and an Sn powder are weighed to provide the composition represented by $Mg_2Sn$, and these powders are mixed to obtain a mixture. This mixture is heated to mutually diffuse Mg and Sn and obtain an aggregate. The aggregate is disintegrated to obtain an $Mg_2Sn$ powder.

The particle diameters of Mg powder and Sn powder, the heating temperature, the heating time, the heating atmosphere, and the atmosphere pressure follow those in the preparation of the $Mg_2Si_{1-x}Sn_x$ ($0.6 \leq x \leq 0.7$) powder. In the case of adding the second n-type dopant to $Mg_2Sn$, the particle diameter of the second n-type dopant powder follows the particle diameter of the first n-type dopant powder.

Using the thus-obtained powders, the thermoelectric conversion device is produced as follows.

The $Mg_2Sn$ powder is charged into a mold having spread on the inner side thereof a carbon sheet and compacted to obtain a first green compact. After further charging the $Mg_2Si_{1-x}Sn_x$ ($0.6 \leq x \leq 0.7$) powder onto the first green compact, these were compacted to obtain a second green compact. The second green compact is pressure-sintered to obtain a first sintered body. In addition, the powder of a raw material constituting the p-type thermoelectric converter is charged into a mold, and the powder is compacted to obtain a third green compact. The third green compact is pressure-sintered to obtain a second sintered body. Subsequently, a commonly-shared high temperature-side electrode is bonded to one end of the first sintered body and one end of the second sintered body, a first low temperature-side electrode is bonded to another end of the first sintered body, and a second low temperature-side electrode is bonded to another end of the second sintered body.

The compacting method may be a conventional method and includes, for example, press molding. The compacting conditions are not particularly limited as long as a compact can be produced. The compacting pressure may be, for example, 10 MPa or more, 20 MPa or more, or 30 MPa or more, and may be 100 MPa or less, 80 MPa or less, 60 MPa or less, or 40 MPa or less.

The pressure sintering method follows the pressure sintering method at the time of production of the conventional π-type thermoelectric conversion device. The method includes, for example, Spark Plasma Sintering (SPS). The sintering pressure may be, for example, 10 MPa or more, 20 MPa or more, or 30 MPa or more, and may be 100 MPa or less, 80 MPa or less, 60 MPa or less, or 40 MPa or less. The sintering temperature may be 600° C. or more, 640° C. or more, or 680° C. or more, and may be 800° C. or less, 760° C. or less, or 720° C. or less. The sintering time may be 10 minutes or more, or 15 minutes or more, and may be 120 minutes or less, 80 minutes or less, or 40 minutes or less. In order to prevent oxidation of the powder, the sintering atmosphere is preferably an inert gas atmosphere or a reducing atmosphere. The inert gas atmosphere includes a nitrogen gas atmosphere. The reducing atmosphere includes a hydrogen gas atmosphere or a mixed gas atmosphere of inert gas and hydrogen gas.

The bonding method follows the bonding method at the time of production of the conventional π-type thermoelectric conversion device. The method includes, for example, brazing.

The first green compact or the first sintered body is preferably heat-treated. By the heat treatment, atoms constituting $Mg_2Sn$ and $Mg_2Si_{1-x}Sn_x$ ($0.6 \leq x \leq 0.7$) are mutually diffused therebetween. As a result, the difference between the energy level at the bottom of the conduction band of $Mg_2Sn$ and the energy level at the bottom of the conduction band of $Mg_2Si_{1-x}Sn_x$ ($0.6 \leq x \leq 0.7$) is decreased in the vicinity of the junction between the carrier generation semiconductor 12 and the carrier transfer semiconductor 16. This makes it easy for the majority carrier to transfer from the carrier generation semiconductor to the carrier transfer semiconductor.

EXAMPLES

The present invention is described more specifically below by referring to Examples. The present invention is not limited to the conditions employed in the following Examples.

(Preparation of Sample)

A sample simulating the n-type thermoelectric converter 10 of the thermoelectric conversion device 100 of the present invention was prepared as follows.

Example

An Mg powder, an Si powder, an Sn powder and a Bi powder were weighed to provide the composition represented by $Mg_2Si_{0.304}Sn_{0.660}Bi_{0.036}$, and these powders were mixed. The mixed powder was charged into a closed vessel and heated. By this heating, the Mg powder and the Sn powder were melted, and Mg, Sn and Bi were diffused into the Si powder. The massive material after heating was crushed to obtain a $Mg_2Si_{0.304}Sn_{0.660}Bi_{0.036}$ powder.

An Mg powder and an Sn powder were weighed to provide the composition represented by $Mg_2Sn$, and these powders were mixed. The mixed powder was charged into a closed vessel and heated. By this heating, both the Mg powder and the Sn powder were melted, and Mg and Sn were mutually diffused. The massive material after heating was crushed to obtain a $Mg_2Sn$ powder.

The particle diameters and blending amounts of the Mg powder, Si powder, Sn powder and Bi powder and the heating conditions, in the preparation of the $Mg_2Si_{0.304}Sn_{0.660}Bi_{0.036}$ powder and $Mg_2Sn$ powder, are shown in Table 1.

the columnar sample, and the entirety was heated to the measurement temperature. At this time, a temperature difference of 10° C. was created between upper and lower copper blocks, and the voltage at which the current becomes zero was measured between two points near the center of the sample. The absolute value of the Seebeck coefficient α was calculated from the measured voltage value. Incidentally, the temperature of the copper block on the side in contact with $Mg_2Sn$ was made higher than that of the copper block on the side in contact with $Mg_2Si_{0.304}Sn_{0.660}Bi_{0.036}$.

Figure 5:
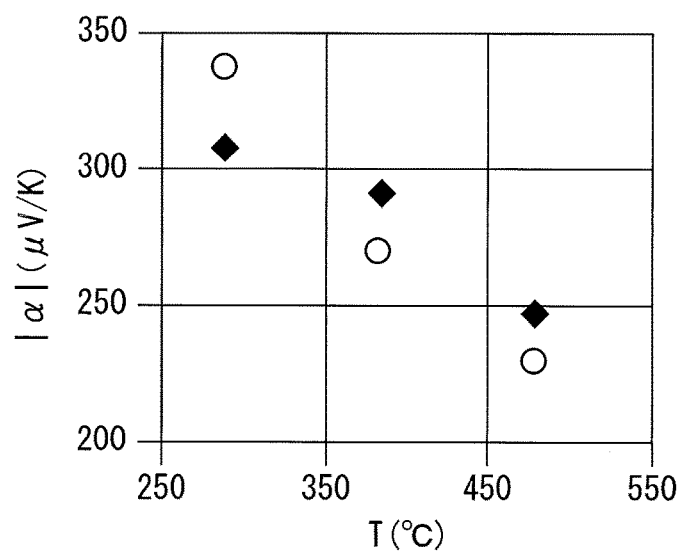
FIG. 5 A graph illustrating the relationship between the measurement temperature T (° C.) and the absolute value (μV/K) of the Seebeck coefficient α.

FIG. 5 illustrates the results. FIG. 5 is a graph illustrating the relationship between the measurement temperature T (° C.) and the absolute value (μV/K) of the Seebeck coefficient α. Here, the measurement temperature T (° C.) is the temperature near the central part of the sample.

As seen from FIG. 5, it could be confirmed that in the sample having the carrier generation semiconductor 12 (Example), the absolute value of the Seebeck coefficient

TABLE 1

| | | Mixing Conditions | | Heating Conditions | | | |
|---|---|---|---|---|---|---|---|
| | | Particle Diameter (μm) | Blending Amount (g) | Temperature (° C.) | Time (min) | Atmosphere | Atmosphere Pressure (MPa) |
| Mg2Si0.304Sn0.660Bi0.036 Powder | Mg Powder | <180 | 1.77340 | 700 | 720 | argon | 0.01 |
| | Si Powder | <45 | 0.31150 | | | | |
| | Sn Powder | <38 | 2.85750 | | | | |
| | Bi Powder | 1-2 | 0.27444 | | | | |
| Mg2Sn Powder | Mg Powder | <180 | 2.37500 | 700 | 720 | argon | 0.01 |
| | Sn Powder | <38 | 5.57530 | | | | |

An $Mg_2Sn$ powder was weighed, and the powder was charged into the bottom of a mold and compacted (first compacting) to obtain a first green compact. An $Mg_2Si_{0.304}Sn_{0.660}Bi_{0.036}$ powder was weighed, and the powder was charged onto the first green compact in the mold and compacted (second compacting) to obtain a second green compact. The second green compact was pressure-sintered by the spark plasma sintering method to obtain a sintered body. The amounts of the $Mg_2Sn$ powder and $Mg_2Si_{0.304}Sn_{0.660}Bi_{0.036}$ powder charged, the first compacting pressure, the second compacting pressure, and the pressure sintering conditions are shown in Table 2. The thus-obtained sintered body was used as the sample of Example.

rises at a high temperature, compared with the sample not having the carrier generation semiconductor 12 (Comparative Example).

From these results, the present invention could be verified to provide prominent effects.

DESCRIPTION OF NUMERICAL REFERENCES

10 n-Type thermoelectric converter
12, 22 Carrier generation semiconductor
16, 26 Carrier transfer semiconductor
20 p-Type thermoelectric converter
30 High temperature-side electrode

TABLE 2

| | | First | Second | Pressure Sintering Conditions | | | |
|---|---|---|---|---|---|---|---|
| | Amount Charged (g) | Compacting Pressure (MPa) | Compacting Pressure (MPa) | Sintering Pressure (MPa) | Sintering Temperature (° C.) | Sintering Atmosphere | Sintering Time (min.) |
| Mg2Sn Powder | 0.5654 | 30 | 30 | 30 | 700 | argon | 15 |
| Mg2Si0.304Sn0.660Bi0.036 Powder | 2.6000 | | | | | | |

Comparative Example

The sample of Comparative Example was prepared in the same manner as in Example except that the $Mg_2Sn$ powder was not prepared and the sample as a whole was $Mg_2Si_{0.304}Sn_{0.660}Bi_{0.036}$.

(Evaluation)

Each of the samples of Example and Comparative Example was measured for the Seebeck coefficient α (μV/K). A copper block was put into contact with both ends of

41 First low temperature-side electrode
42 Second low temperature-side electrode
52 Forbidden band of carrier generation semiconductor
56 Forbidden band of carrier transfer semiconductor
57 Forbidden band in region in contact with carrier generation semiconductor
58 Forbidden band in region in contact with first low temperature-side electrode
100 Thermoelectric conversion device

The invention claimed is:

1. A thermoelectric conversion device comprising:
an n-type thermoelectric converter,
a p-type thermoelectric converter,
a high temperature-side electrode with which one end of the n-type thermoelectric converter and one end of the p-type thermoelectric converter are put into contact,
a first low temperature-side electrode in contact with another end of the n-type thermoelectric converter, and
a second low temperature-side electrode in contact with another end of the p-type thermoelectric converter,
wherein
in the n-type thermoelectric converter, the side in contact with the high temperature-side electrode is composed of a carrier generation semiconductor containing $Mg_2Sn$, and
in the n-type thermoelectric converter, the side in contact with the first low temperature-side electrode is composed of a carrier transfer semiconductor containing $Mg_2Si_{1-x}Sn_x$, wherein $0.6 \leq x \leq 0.7$, and a first n-type dopant.

2. The thermoelectric conversion device according to claim 1, wherein an energy level at a top of a valence band is lower in the carrier transfer semiconductor than in the carrier generation semiconductor.

3. The thermoelectric conversion device according to claim 1, wherein a concentration of the first n-type dopant in the carrier transfer semiconductor increases from a side of the carrier transfer semiconductor interfacing with the carrier generation semiconductor toward a side of the carrier transfer semiconductor in contact with the first low temperature-side electrode.

4. The thermoelectric conversion device according to claim 1, wherein
the carrier transfer semiconductor has a plurality of regions, and
a concentration of the first n-type dopant in the plurality of regions increases from a side of the carrier transfer semiconductor interfacing with the carrier generation semiconductor toward a side of the carrier transfer semiconductor in contact with the first low temperature-side electrode.

5. The thermoelectric conversion device according to claim 1, wherein the first n-type dopant is selected from a group consisting of Sb, Bi, Al, and combinations thereof.

6. The thermoelectric conversion device according to claim 1, wherein the carrier generation semiconductor further contains one or more second n-type dopants selected from Sb, Bi and Al.

* * * * *